United States Patent
Agoston et al.

(10) Patent No.: US 12,146,914 B2
(45) Date of Patent: Nov. 19, 2024

(54) BIT ERROR RATIO ESTIMATION USING MACHINE LEARNING

(71) Applicant: Tektronix, Inc., Beaverton, OR (US)

(72) Inventors: Maria Agoston, Beaverton, OR (US); John J. Pickerd, Hillsboro, OR (US); Kan Tan, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 99 days.

(21) Appl. No.: 17/745,797

(22) Filed: May 16, 2022

(65) Prior Publication Data
US 2022/0373597 A1 Nov. 24, 2022

Related U.S. Application Data

(60) Provisional application No. 63/189,886, filed on May 18, 2021.

(51) Int. Cl.
*G01R 31/319* (2006.01)
*G01R 31/26* (2020.01)
(Continued)

(52) U.S. Cl.
CPC ....... *G01R 31/31908* (2013.01); *G01R 31/26* (2013.01); *H04B 17/0085* (2013.01); *H04L 1/203* (2013.01)

(58) Field of Classification Search
CPC .............. G01R 31/31908; G01R 31/26; G01R 31/31711; G01R 31/3171; H04B 17/0085;
(Continued)

(56) References Cited

U.S. PATENT DOCUMENTS 5,272,723 A 12/1993 Kimoto
5,397,981 A 3/1995 Wiggers
(Continued)

FOREIGN PATENT DOCUMENTS

CN 107342810 11/2019
EP 2743710 9/2018
(Continued)

OTHER PUBLICATIONS

Varughese, Siddarth, et al., Accelerating Assessments of Optical Components Using Machine Learning: TDECQ as Demonstrated Example, Journal of Lightwave Technology, Jan. 1, 2021, pp. 64-72, vol. 39, No. 1, IEEE.
(Continued)

*Primary Examiner* — James C Kerveros
(74) *Attorney, Agent, or Firm* — Miller Nash LLP; Andrew J. Harrington

(57) ABSTRACT

A test and measurement system includes a machine learning system, a test and measurement device including a port configured to connect the test and measurement device to a device under test (DUT), and one or more processors, configured to execute code that causes the one or more processors to: acquire a waveform from the device under test (DUT), transform the waveform into a composite waveform image, and send the composite waveform image to the machine learning system to obtain a bit error ratio (BER) value for the DUT. A method of determining a bit error ratio for a device under test (DUT), includes acquiring one or more waveforms from the DUT, transforming the one or more waveforms into a composite waveform image, and sending the composite waveform image to a machine learning system to obtain a bit error ratio (BER) value for the DUT.

19 Claims, 4 Drawing Sheets

(51) Int. Cl.
  *H04B 17/00* (2015.01)
  *H04L 1/20* (2006.01)
(58) Field of Classification Search
  CPC .. H04B 17/17; H04B 17/3913; H04B 17/309; H04B 17/336; H04L 1/203; H04L 1/24; G06N 20/00
  USPC .......................................................... 714/724
  See application file for complete search history.

(56) References Cited

U.S. PATENT DOCUMENTS

| | | |
|---|---|---|
| 5,594,655 A | 1/1997 | Berchin |
| 6,807,496 B2 | 10/2004 | Pickerd |
| 7,181,146 B1 | 2/2007 | Yorks |
| 7,298,463 B2 | 11/2007 | French |
| 8,583,395 B2 | 11/2013 | Dybsetter |
| 8,861,578 B1 | 10/2014 | Lusted |
| 9,059,803 B2 | 6/2015 | Detofsky |
| 9,130,751 B2 | 9/2015 | Zivny |
| 9,337,993 B1 | 5/2016 | Lugthart |
| 9,548,858 B1 | 1/2017 | Cirit |
| 9,699,009 B1 | 7/2017 | Ainspan |
| 9,709,605 B2 | 7/2017 | Alley |
| 10,171,161 B1 | 1/2019 | Cote |
| 10,209,276 B2 | 2/2019 | Tan |
| 10,236,982 B1 | 3/2019 | Zhuge |
| 10,270,527 B1 | 4/2019 | Mentovich |
| 10,396,897 B1 | 8/2019 | Malave |
| 10,585,121 B2 | 3/2020 | Absher |
| 10,727,973 B1 | 7/2020 | Kumar |
| 10,852,323 B2 | 12/2020 | Schaefer |
| 10,863,255 B2 | 12/2020 | Zhang |
| 11,005,697 B2 | 5/2021 | Liston |
| 11,040,169 B2 | 6/2021 | Jung |
| 11,095,314 B2 | 8/2021 | Medard |
| 11,177,986 B1 | 11/2021 | Ganesan |
| 11,233,561 B1 | 1/2022 | O'Shea |
| 11,237,190 B2 | 2/2022 | Rule |
| 11,336,378 B2 | 5/2022 | Bottoni |
| 11,388,081 B1* | 7/2022 | Sommers ................ H04L 49/70 |
| 11,476,967 B2 | 10/2022 | Geng |
| 11,646,863 B2 | 5/2023 | Balan |
| 11,695,601 B2 | 7/2023 | Sudhakaran |
| 2002/0063553 A1* | 5/2002 | Jungerman ................ H04L 1/24 |
| | | 324/76.24 |
| 2003/0053170 A1 | 3/2003 | Levinson |
| 2003/0208330 A1 | 11/2003 | Pickerd |
| 2003/0220753 A1 | 11/2003 | Pickerd |
| 2004/0032889 A1 | 2/2004 | Hidaka |
| 2004/0121733 A1 | 6/2004 | Peng |
| 2004/0131365 A1 | 7/2004 | Lee |
| 2004/0136422 A1 | 7/2004 | Mahowald |
| 2004/0165622 A1 | 8/2004 | Lu |
| 2004/0223544 A1 | 11/2004 | Upton |
| 2004/0236527 A1 | 11/2004 | Felps |
| 2005/0222789 A1 | 10/2005 | West |
| 2005/0246601 A1 | 11/2005 | Waschura |
| 2005/0249252 A1 | 11/2005 | Sanchez |
| 2006/0120720 A1 | 6/2006 | Hauenschild |
| 2008/0126001 A1 | 5/2008 | Murray |
| 2008/0159737 A1 | 7/2008 | Noble |
| 2008/0212979 A1 | 9/2008 | Ota |
| 2009/0040335 A1* | 2/2009 | Ito ......................... H04N 23/88 |
| | | 348/E9.051 |
| 2011/0085793 A1 | 4/2011 | Oomori |
| 2011/0161738 A1 | 6/2011 | Zhang |
| 2011/0286506 A1 | 11/2011 | Libby |
| 2012/0226727 A1 | 9/2012 | Zivny |
| 2013/0046805 A1 | 2/2013 | Smith |
| 2014/0093233 A1 | 4/2014 | Gao |
| 2014/0163914 A1 | 6/2014 | Alley |
| 2014/0343883 A1 | 11/2014 | Libby |
| 2015/0003505 A1 | 1/2015 | Lusted |
| 2015/0055694 A1 | 2/2015 | Juenemann |
| 2015/0207574 A1 | 7/2015 | Schoen |
| 2015/0350042 A1 | 12/2015 | Zivny |
| 2016/0191168 A1 | 6/2016 | Huang |
| 2016/0328501 A1 | 11/2016 | Chase |
| 2018/0006721 A1 | 1/2018 | Ishizaka |
| 2018/0045761 A1 | 2/2018 | Tan |
| 2018/0074096 A1 | 3/2018 | Absher |
| 2018/0204117 A1 | 7/2018 | Brevdo |
| 2018/0219636 A1* | 8/2018 | Gale .................. H04B 17/0085 |
| 2018/0356655 A1 | 12/2018 | Welch |
| 2019/0038387 A1 | 2/2019 | Chu |
| 2019/0278500 A1* | 9/2019 | Lakshmi ............... G06F 3/0688 |
| 2019/0332941 A1 | 10/2019 | Towal |
| 2019/0370158 A1* | 12/2019 | Rivoir ................. G06F 11/3672 |
| 2019/0370631 A1 | 12/2019 | Fais |
| 2020/0035665 A1 | 1/2020 | Chuang |
| 2020/0057824 A1 | 2/2020 | Yeh |
| 2020/0166546 A1 | 5/2020 | O'Brien |
| 2020/0195353 A1 | 6/2020 | Ye |
| 2020/0229206 A1* | 7/2020 | Badic ................ H04W 52/0209 |
| 2020/0313999 A1* | 10/2020 | Lee ..................... H04L 43/0847 |
| 2020/0335029 A1 | 10/2020 | Gao |
| 2021/0041499 A1* | 2/2021 | Ghosal .................. G06F 11/076 |
| 2021/0105548 A1 | 4/2021 | Ye |
| 2021/0111794 A1 | 4/2021 | Huang |
| 2021/0160109 A1 | 5/2021 | Seol |
| 2021/0167864 A1 | 6/2021 | Razzell |
| 2021/0314081 A1 | 10/2021 | Shattil |
| 2021/0389373 A1 | 12/2021 | Pickerd |
| 2021/0390456 A1 | 12/2021 | Pickerd |
| 2022/0070040 A1 | 3/2022 | Namgoong |
| 2022/0076715 A1 | 3/2022 | Lee |
| 2022/0121388 A1 | 4/2022 | Woo |
| 2022/0182139 A1 | 6/2022 | Zhang |
| 2022/0199126 A1 | 6/2022 | Lee |
| 2022/0200712 A1 | 6/2022 | Lillie |
| 2022/0215865 A1 | 7/2022 | Woo |
| 2022/0236326 A1 | 7/2022 | Schaefer |
| 2022/0239371 A1 | 7/2022 | Xu |
| 2022/0247648 A1 | 8/2022 | Pickerd |
| 2022/0311513 A1 | 9/2022 | Pickerd |
| 2022/0311514 A1 | 9/2022 | Smith |
| 2022/0334180 A1 | 10/2022 | Pickerd |
| 2022/0373597 A1 | 11/2022 | Agoston |
| 2022/0373598 A1 | 11/2022 | Tan |
| 2022/0385374 A1 | 12/2022 | Arikawa |
| 2022/0390515 A1 | 12/2022 | Pickerd |
| 2022/0393914 A1 | 12/2022 | Tan |
| 2022/0407595 A1 | 12/2022 | Varughese |
| 2023/0050162 A1 | 2/2023 | Tan |
| 2023/0050303 A1 | 2/2023 | Pickerd |
| 2023/0052588 A1 | 2/2023 | Sudhakaran |
| 2023/0088409 A1 | 3/2023 | Parsons |
| 2023/0098379 A1 | 3/2023 | Smith |
| 2023/0194599 A1* | 6/2023 | Gilabert .................. G06T 7/001 |
| | | 324/762.02 |
| 2023/0228803 A1 | 7/2023 | Sun |
| 2023/0239182 A1 | 7/2023 | Ikeda |
| 2023/0299862 A1 | 9/2023 | O'Shea |
| 2023/0306578 A1 | 9/2023 | Pickerd |

FOREIGN PATENT DOCUMENTS

| | | |
|---|---|---|
| EP | 3936877 | 1/2022 |
| JP | 6560793 | 8/2019 |
| WO | 2021092156 | 5/2021 |
| WO | 2022171645 | 8/2022 |
| WO | 2022189613 | 9/2022 |

OTHER PUBLICATIONS

Varughese, Siddarth, et al., Accelerating TDECQ Assessments using Convolutional Neural Networks, OFC, Mar. 2020, 3 pages, The Optical Society (OSA).

Watts et al., "Performance of Single-Mode Fiber Links Using Electronic Feed-Forward and Decision Feedback Equalizers", 2005, IEEE Photonics Techology Letters, vol. 17, No. 10, pp. 2206-2208 (Year: 2005).

(56) References Cited

OTHER PUBLICATIONS

Echeverri-Chacon et al., "Transmitter and Dispersion Eye Closure Quaternary (TDECQ) and Its Sensitivity to Impairments in PAM4 Waveforms", 2019, Journal of Lightwave Technology, vol. 37, No. 3, pp. 852-860 (Year: 2019).

Wang et al., "Intelligent Constellation Diagram Analyzer Using Convolutional Neural Network-Based Deep Learning," Optics Express, Jul. 24, 2017, vol. 25, No. 15.

* cited by examiner

BIT ERROR RATIO ESTIMATION USING MACHINE LEARNING

CROSS-REFERENCE TO RELATED APPLICATIONS

This disclosure claims benefit of U.S. Provisional Application No. 63/189,886, titled "BIT ERROR RATIO ESTIMATION USING MACHINE LEARNING," filed on May 18, 2021, the disclosure of which is incorporated herein by reference in its entirety.

TECHNICAL FIELD

This disclosure relates to test and measurement systems and methods, and more particularly to estimating a bit error ratio (BER) of data acquired using a test and measurement instrument.

BACKGROUND

Bit error ratio (BER) testing measures signal integrity in a signal channel based on the quantity or percentage of transmitted bits received incorrectly. The higher number of incorrect bits indicates poor channel quality.

Conventional BER testing normally involves a dedicated piece of BER testing equipment, not a sampling oscilloscope. The device under test (DUT) sends out a known pattern and the equipment checks for errors by comparing the known pattern to the received pattern.

Issues with this method of testing include having to transmit a large number of bits in order to obtain enough data to compute very small BER values. This takes up a lot of time, which in turn increases the costs. One customer estimate requires four minutes to obtain the value on a manufacturing line. The line must test hundreds of thousands of optical transceivers, or other kinds of DUTs. Another challenge is that the behavioral receiver equalizer is hard or costly to implement in the dedicated BER test system.

DESCRIPTION

The embodiments here reduce the amount of time needed to compute the bit error ratio (BER) for devices under test (DUT), including optical and electrical transceivers. The embodiments here provide devices and methods for performing bit error ratio testing using an oscilloscope, instead of specialized equipment, in a much faster manner than conventional testing. The embodiments here are also hardware agnostic, not being limited to a particular type of oscilloscope.

Figure 1:
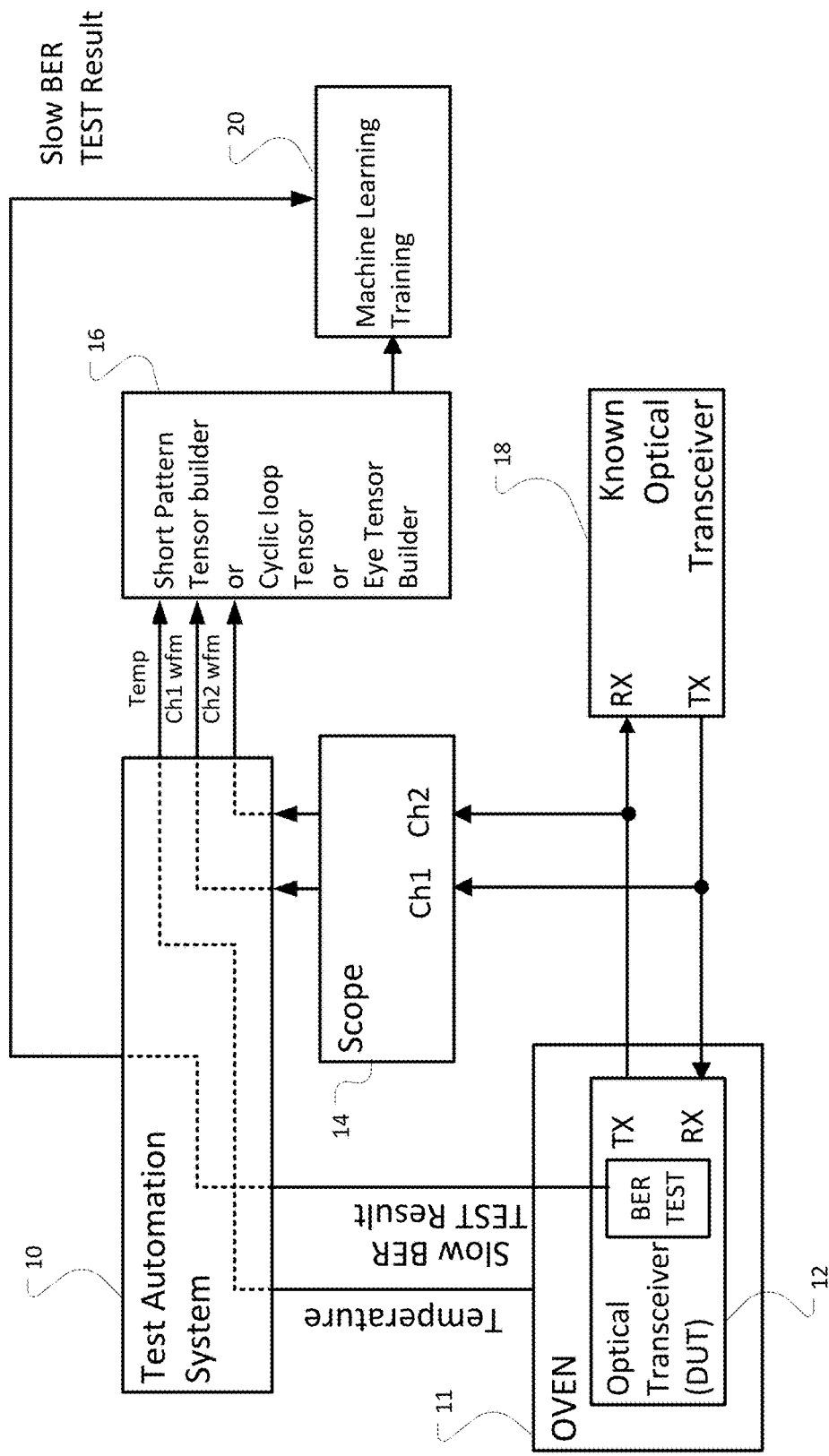
FIG. 1 shows an embodiment of a bit error rate testing system with machine learning training.

FIG. 1 shows a diagram of a test and measurement system configured to test DUTs and obtain BER values for those DUTs in a machine learning training environment. The system includes the customer test automation system 10 used on the customer's manufacturing line, and a DUT 12 that needs to be tested as pass/fail. Components that pass will ultimately be sold by the customer. The DUT may undergo testing in an oven or temperature chamber 11. The test automation system receives the temperature from the oven and the conventional or "slow" BER test results.

A test and measurement device 14, typically an oscilloscope (or "scope") but may comprise other test and measurement devices, captures signals from the DUT and generates one or more waveforms from those signals. The signals may result from the DUT sending and receiving signals with a known device 18, in this case an optical transceiver that has known and stable characteristics. The scope 14 acquires the waveforms from the DUT and the module 16, typically part of the machine learning system, transforms the waveform into a composite waveform image for use in the machine learning system 20. The test automation system 10 provides the temperature to the module 16, and the conventional BER test results to the machine learning system 20 for training. In some embodiments, the module 16 may be part of the scope 14; in some embodiments, the module 16 may be separate from the scope and the machine learning system 20.

Figure 4:
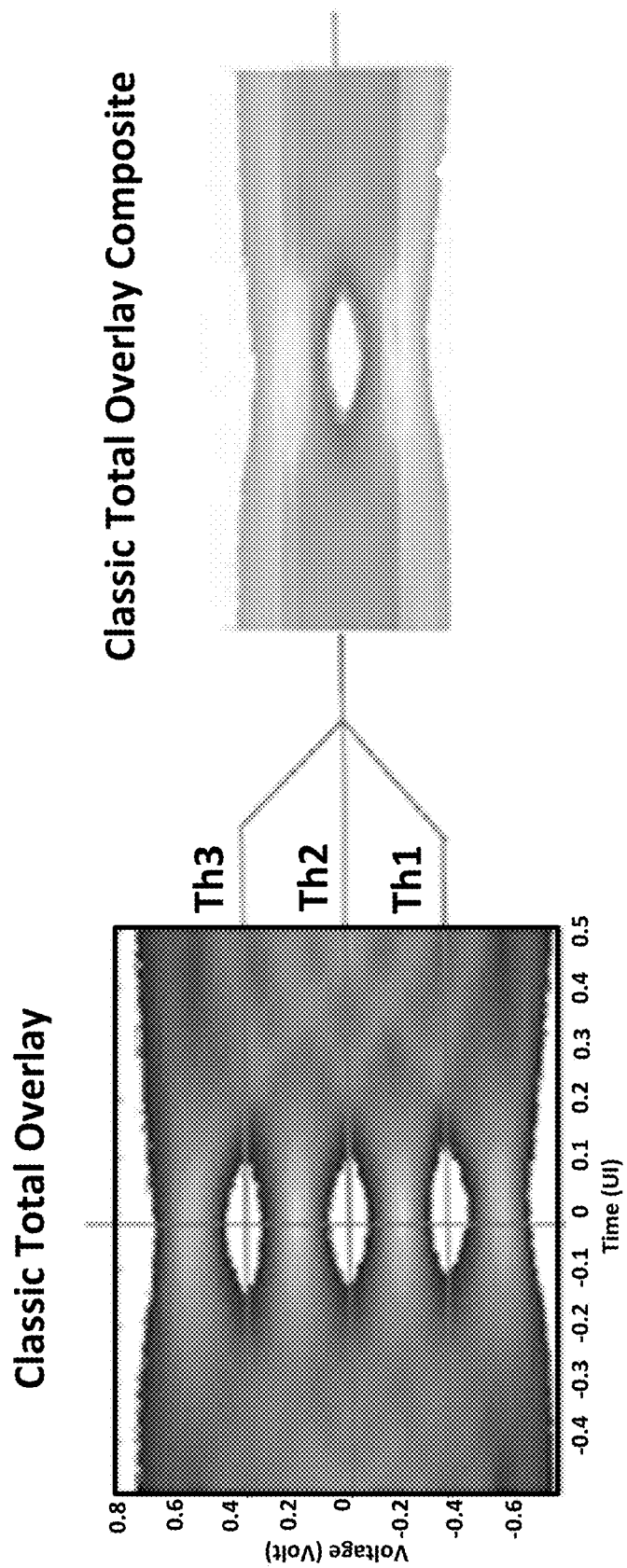
FIG. 4 shows an example of a composite eye diagram.

The composite waveform image may take many forms. For example, the scope may take a PAM4 (Pulse Amplitude Modulated 4-level) signal and produce three diagrams from the acquired waveforms, each having what is referred to as an 'eye opening.' These may be overlaid into a single composite eye diagram with a single composite threshold. FIG. 4 shows an example of the resulting composite eye waveform image.

This is one example of a composite waveform image produced by module 16. U.S. patent application Ser. No. 17/592,437, "EYE CLASSES SEPARATOR WITH OVERLAY, AND COMPOSITE, AND DYNAMIC EYE-TRIGGER FOR HUMANS AND MACHINE LEARNING," filed Feb. 3, 2022, describes methods of generating a composite eye waveform image. This application is incorporated herein in its entirety. This is one example of a type of composite waveform image. Other types include short pattern tensor images, cyclic loop tensors, and eye diagram overlays. U.S. patent application Ser. No. 17/345,283, titled "A CYCLIC LOOP IMAGE REPRESENTATION FOR WAVEFORM DATA," filed Jun. 11, 2021, describes generating cyclic loop images. U.S. Prov. Pat. App. No. 63/191,908, filed May 21, 2021, describes generating short pattern tensor images. These applications are incorporated herein in their entireties.

The image provided to the machine learning system may comprise tensor images placed onto the different color channels of an RGB image input. The system may create a tensor image for the waveform from channel 1 of the scope and place that image on one of the color inputs, such as the red channel. The system would also create a tensor image for the waveform from channel 2 of the scope and place that on the blue channel. Graphs representing the temperature may then be provided on the green channel, as an example.

FIG. 1 shows the training environment. The DUT may be tested by relying upon the "known good" transceiver 18, as shown. Alternatively, the DUT may have its receiver and transmitter connected together in a loop-back fashion. The BER test involves transmitting a known pattern and then decoding the received pattern and comparing it to the known pattern. The BER is the ratio of the bit errors to the received number of bits in the pattern. The conventional testing requires transmissions having large numbers of bits to compute the relatively small BER values in the range of 1e-4, 1e-12, etc.

However, the machine learning system needs a BER value associated with each composite waveform image for training. Each composite waveform image and its associated BER value are provided to the machine learning system as a data sample for one training cycle. This process repeats for as many transceivers as necessary to train the machine learning system sufficiently to meet a desired level of accuracy. Typically, machine learning systems undergo testing and validation during training to ensure that the prediction accuracy meets the needed requirements. One way of defining the accuracy is to make the scatter plots of actual BER value on the horizontal axis plotted against the machine learning "predicted value" on the vertical axis. One could then compute the standard deviation of the difference between the predicted and actual and use that as an indicator of the accuracy of the measurement. These may be made at training time, using a large waveform training set with associated actual BER values. The waveforms can be fed into the training networks to obtain the predicted values.

It is assumed that the manufacturing process will build the DUTs to achieve a BER value within a relatively small range. Therefore, the machine learning system needs sufficient training to recognize BER for the devices over the range seen during the manufacture of the devices. This requires high enough resolution in the composite waveform image that allows observation of the small range.

One approach to make the smaller BER counts visible in the composite waveform image involves some dynamic range compression. By compressing the dynamic range of the image, it makes the smaller counts more visible in the image relative to the larger counts. The dynamic range compression or correction may take the form of a gamma correction or other log function. Gamma correction refers to a process of encoding linear gain values in images to a non-linear relationship, originally stemming for the use of CRT monitors. Using an image with a dynamic range compression improves the training of the machine learning system so that it more readily determines small changes in the BER around the nominal manufacturing value.

Once trained, the machine learning system will have learned to associate particular composite waveform images with BER values provided for those images. This will allow it to associate new composite waveform images during runtime with BER values with high accuracy. The manufacturing system can then use the estimated BER from the machine learning system as the BER value to determine pass or fail of the DUT.

Figure 2:
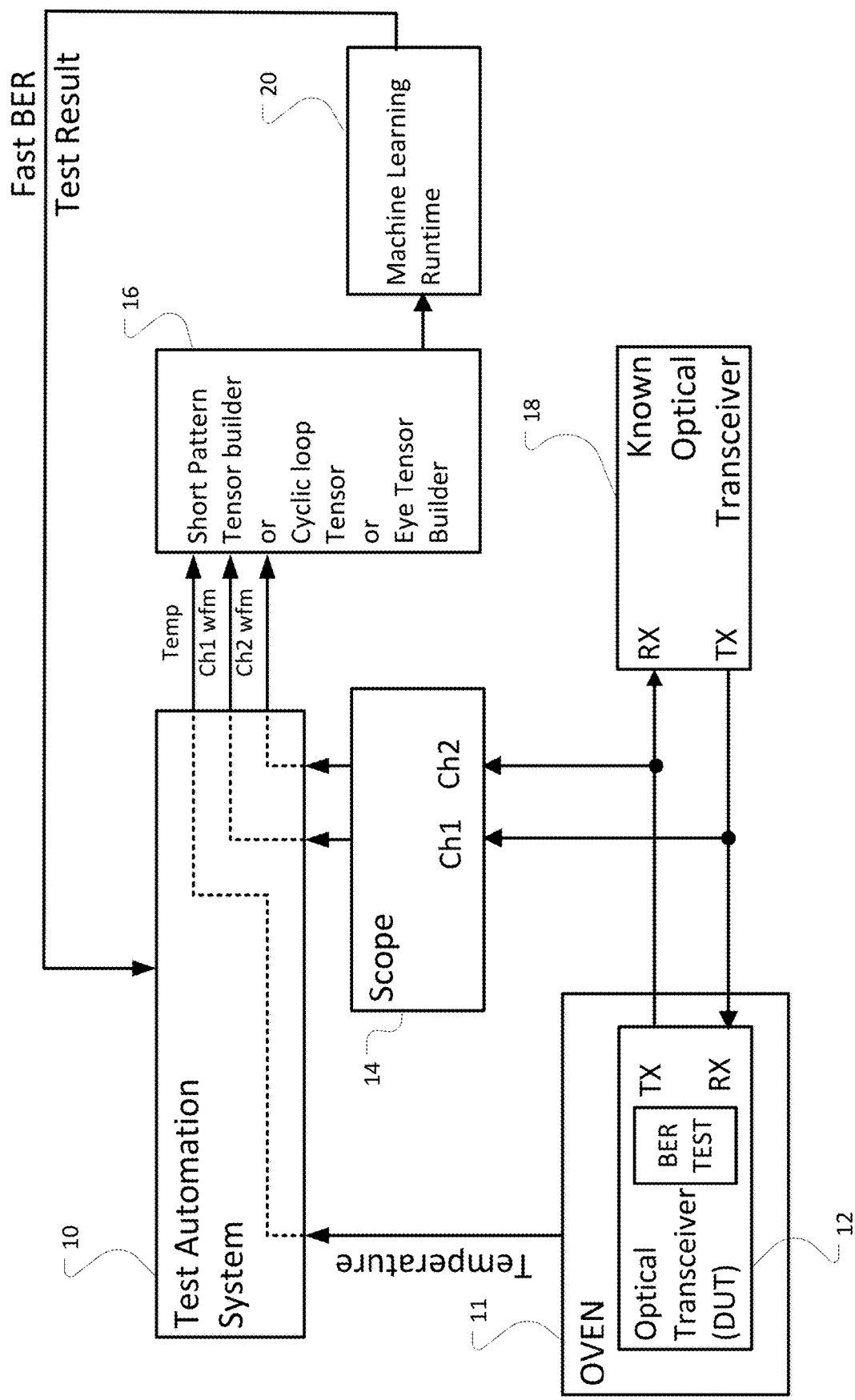
FIG. 2 shows an embodiment of a bit error rate testing system in a run time environment.

FIG. 2 shows the runtime environment. In FIG. 2, the system no longer needs the conventional measurement, although one could perform it periodically as an accuracy check against the machine learning estimation. The DUT 12 transmits and receives with the known device 18. In one embodiment, the transmission path from the DUT connects to a first channel of the scope 14 and the reception path going to the DUT connects to a separate channel.

The scope then acquires the waveform and the machine learning system receives it and sends it to the ML BER system, which generates the composite waveform image of whichever type is used in this instance, as discussed above at 16. The composite waveform image is then sent to the machine learning system 20, along with the temperature from the test automation system. The machine learning system then outputs the BER result from the machine learning system and communicates it back to the test automation software with the BER value. This will then cause the test automation system to pass or fail the DUT.

If the DUT fails, the process could also compute the BER in the conventional manner as a double-check of the BER estimation from the machine learning system, but that may slow the process down too much. Alternatively, that component could undergo conventional testing away from the manufacturing system to compare the BER estimation from the machine learning system to the conventional result. If the values become consistently too far apart, the machine learning system may need to undergo another training process.

Figure 3:
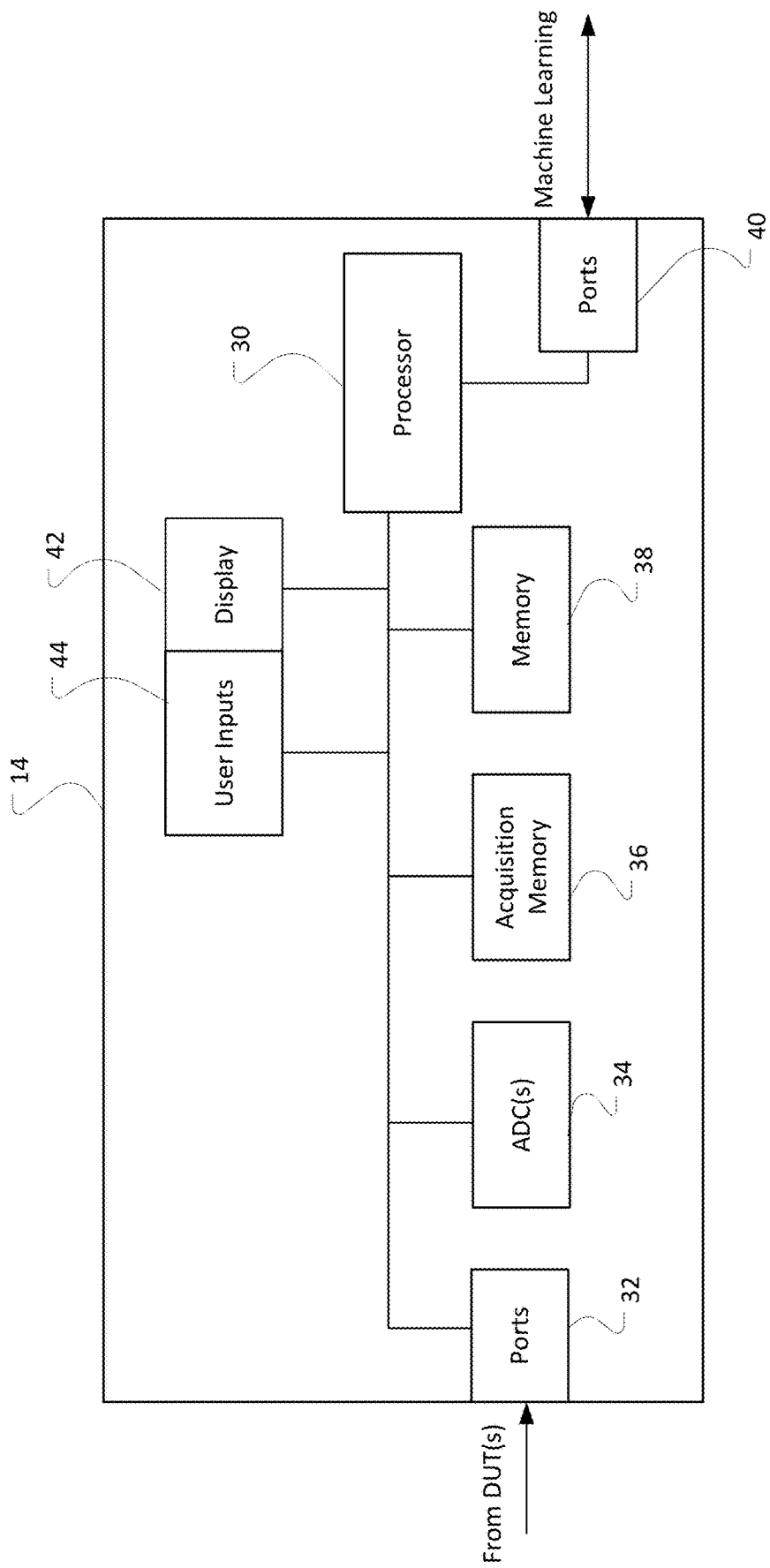
FIG. 3 shows an embodiment of a test and measurement device.

The test and measurement device 14 that acquires the waveform and/or the module 16 that renders the composite waveform image may have one or more processors to perform those tasks. FIG. 3 shows an embodiment of the test and measurement device. The test and measurement device 14 may include several components, and the ones described here are not intended to be exhaustive. The test and measurement device 14 may include one or more processors 30. The one or more processors will be configured to execute code that will cause the one or more processors to perform the processes discussed here. The various processing tasks performed within the system may be distributed between the test automation system, the one or more processors in the scope and the machine learning system. These processors are all included in the test and measurement system, of which the test and measurement device is one part.

The test and measurement device 14 may also include ports 32 that provide connection to the DUT(s), such as probes that connect to channels in the device, as discussed above. The device may include one or more analog-to-digital converters (ADCs) 34 that convert the incoming analog signal into digitized samples. The device will include at least one memory, such as an acquisition memory 36 that stores the digitized samples and the BER values used in training, etc. Memory 38 may be combined with memory 36 and may store the code to be executed by the processor 30, as well as store user settings, etc. The user inputs 44 may include knobs, buttons, and other controls. The display 42 displays the waveforms and resulting measurements to the user. The display may optionally incorporate user controls if the display 42 is a touch screen display. The device then sends the information from the DUT to the machine learning system through communication port 40.

In this manner, a machine learning system can produce BER estimation values for DUTs much faster than conventional testing. One estimate of conventional testing took 4 minutes per DUT on the manufacturing line. Using machine learning, current testing runs around 0.45 seconds per DUT, approximately 0.2% of the time it takes to test using conventional methods.

Generally, acquiring the waveform may take 2-3 seconds. However, the possibility exists that getting the BER estimation from the machine learning system could take longer than the waveform acquisition. If this case were to arise, one could parallelize the process by acquiring a first waveform and sending it to a first processor for generating of the composite waveform image and sending it to the machine learning system, meanwhile acquiring a second waveform and sending it to a second processor while awaiting the first results. Once all processors have received their results, one could average the BER estimations to provide a final BER value. However, in current testing, the machine learning system provides the BER values much faster than even the time to acquire the waveform.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA (field-programmable gate array), and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Examples

Illustrative examples of the disclosed technologies are provided below. An embodiment of the technologies may include one or more, and any combination of, the examples described below.

Example 1 is a test and measurement system, comprising: a machine learning system; a test and measurement device including a port configured to connect the test and measurement device to a device under test (DUT); and one or more processors, configured to execute code that causes the one or more processors to: acquire a waveform from the DUT; transform the waveform into a composite waveform image; and send the composite waveform image to the machine learning system to obtain a bit error ratio (BER) value for the DUT.

Example 2 is the test and measurement system of Example 1, wherein the one or more processors are distributed among the test and measurement device, a test automation system and the machine learning system.

Example 3 is the test and measurement system of either of Examples 1 and 2, wherein the composite waveform image comprises one of a short pattern tensor, a cyclic loop tensor or an eye diagram overlay.

Example 4 is the test and measurement system of any of Examples 1 through 3, further comprising a known device connected to the DUT, the known device to transmit a known pattern along a transmission path to the DUT and receive a pattern from the DUT along a reception path.

Example 5 is the test and measurement system of Example 4, wherein the port comprises a first channel input of the test and measurement device connected to the transmission path and a second channel input of the test and measurement device connected to the reception path.

Example 6 is the test and measurement system of any of Examples 1 through 5, wherein the one or more processors are further configured to execute code to cause the one or more processors to train the machine learning system, the code causing the one or more processors to: acquire a training waveform associated with a signal for which a BER value has been measured and stored; transform the training waveform into a training composite waveform image; and provide the training composite waveform image and the stored BER value to the machine learning system as a training data sample.

Example 7 is the test and measurement system of Example 6, wherein the processors are further configured to repeat the code to cause the one or more processors to train the machine learning system until a sufficient number of training samples have been obtained.

Example 8 is the test and measurement system of any of Examples 1 to 7, wherein the one or more processors are further configured to execute code to cause the one or more processors to apply a dynamic range compression on pixels in the composite waveform image to cause smaller counts in the composite waveform image to be more visible relative to the larger counts in the composite waveform image.

Example 9 is the test and measurement system of Example 8, wherein the dynamic range compression comprises one of either a gamma correction or a log function.

Example 10 is the test and measurement system of any of Examples 1 to 9, wherein the one or more processors are further configured to execute code to cause the one or more processors to obtain a temperature when the waveform from the DUT is acquired and send the temperature to the machine learning system with the composite waveform image.

Example 11 is a method of determining a bit error ratio for a device under test (DUT), comprising: acquiring one or more waveforms from the DUT; transforming the one or more waveforms into a composite waveform image; sending the composite waveform image to a machine learning system to obtain a bit error ratio (BER) value for the DUT.

Example 12 the method of Example 11, wherein transforming the one or more waveforms into the composite waveform image comprises transforming the one or more waveforms into one of a short pattern tensor, a cyclic loop tensor or an eye diagram overlay.

Example 13 is the method of Example 11 or 12, further comprising: connecting a known device the DUT; using the known device to transmit a known pattern along a transmission path to the DUT; and receiving a pattern from the DUT along a reception path.

Example 14 is the method of Example 13, further comprising: connecting a first channel of a test and measurement device to the transmission path; connecting a second channel of the test and measurement device to the reception path; and comparing waveforms acquired from the first channel and the second channel.

Example 15 is the method of any of Examples 11 through 12, further comprising: connecting a loop back path between a transmitter and a receiver on the DUT; measuring the BER for that DUT; storing the BER for that DUT; acquiring a training waveform from the DUT; transforming the training waveform into a training composite waveform image; and providing the training composite waveform image and the stored BER value to the machine learning system as a training data sample.

Example 16 is the method of Example 15, further comprising repeating the method on additional DUTs until a sufficient number of training data samples have been obtained.

Example 17 is the method of any of Examples 11 to 16, further comprising applying a dynamic range compression on pixels in the composite waveform image to cause smaller counts to be more visible in the composite waveform image relative to larger counts.

Example 18 is the method of Example 17, wherein applying a dynamic range further comprising applying one of a gamma correction or a log function to the values in the training composite waveform image.

Example 19 is the method of any of Examples 11 to 18, wherein acquiring one or more waveforms from the DUT further comprises obtaining a testing temperature.

Example 20 is the method of Example 19, wherein transforming the one or more waveforms into the composite waveform image further comprises encoding a graphical representation of the testing temperature into the composite waveform image Although specific aspects of the disclosure have been illustrated and described for purposes of illustration, it will be understood that various modifications may be made without departing from the spirit and scope of the disclosure. Accordingly, the disclosure should not be limited except as by the appended claims.

We claim:
1. A test and measurement system, comprising:
a machine learning system;
a test and measurement device including a port configured to connect the test and measurement device to a device under test (DUT); and
one or more processors, and a memory for storing code, which when executed by the one or more processors, causes the one or more processors to:
acquire one or more waveforms from the DUT by capturing one or more signals from the DUT and generating the one or more waveforms from the one or more signals;
transform the one or more waveforms into a composite waveform image, the composite waveform image based on at least two images from the one or more waveforms; and
send the composite waveform image to the machine learning system to obtain a bit error ratio (BER) value for the DUT.

2. The test and measurement system as claimed in claim 1, wherein the composite waveform image comprises one of a short pattern tensor, a cyclic loop tensor, or an eye diagram overlay.

3. The test and measurement system as claimed in claim 1, further comprising a known device connected to the DUT, the known device to transmit a known pattern along a transmission path to the DUT and receive a pattern from the DUT along a reception path.

4. The test and measurement system as claimed in claim 3, wherein the port comprises a first channel input of the test and measurement device connected to the transmission path and a second channel input of the test and measurement device connected to the reception path.

5. The test and measurement system as claimed in claim 1, wherein the one or more processors are further configured to execute code to cause the one or more processors to train the machine learning system, the code causing the one or more processors to:
acquire a training waveform associated with a signal, the training waveform having a BER value has previously been measured and stored;
transform the training waveform into a training composite waveform image; and
provide the training composite waveform image and the stored BER value to the machine learning system as a training data sample.

6. The test and measurement system as claimed in claim 5, wherein the processors are further configured to repeat the code to cause the one or more processors to train the machine learning system until a sufficient number of training samples have been obtained.

7. The test and measurement system as claimed in claim 1, wherein the one or more processors are further configured to execute code to cause the one or more processors to apply a dynamic range compression on pixels in the composite waveform image.

8. The test and measurement system as claimed in claim 7, wherein the dynamic range compression comprises one of either a gamma correction or a log function.

9. The test and measurement system as claimed in claim 1, wherein the one or more processors are further configured to execute code to cause the one or more processors to obtain a temperature when the waveform from the DUT is acquired and send the temperature to the machine learning system with the composite waveform image.

10. A method of determining a bit error ratio for a device under test (DUT), comprising:

acquiring one or more waveforms from the DUT by receiving one or more signals from the DUT and generating the one or more waveforms from the one or more signals;

transforming the one or more waveforms into a composite waveform image, the composite waveform image based on at least two images from the one or more waveforms; and sending the composite waveform image to a machine learning system to obtain a bit error ratio (BER) value for the DUT.

11. The method as claimed in claim 10, wherein transforming the one or more waveforms into the composite waveform image comprises transforming the one or more waveforms into one of a short pattern tensor, a cyclic loop tensor or an eye diagram overlay.

12. The method as claimed in claim 10, further comprising: connecting a known device the DUT;

using the known device to transmit a known pattern along a transmission path to the DUT; and receiving a pattern from the DUT along a reception path.

13. The method as claimed in claim 12, further comprising:

connecting a first channel of a test and measurement device to the transmission path;

connecting a second channel of the test and measurement device to the reception path; and comparing waveforms acquired from the first channel and the second channel.

14. The method as claimed in claim 10, further comprising:

connecting a loop back path between a transmitter and a receiver on the DUT;

measuring the BER for that DUT;

storing the BER for that DUT;

acquiring a training waveform from the DUT;

transforming the training waveform into a training composite waveform image; and providing the training composite waveform image and the stored BER value to the machine learning system as a training data sample.

15. The method as claimed in claim 14, further comprising repeating the method on additional DUTs until a sufficient number of training data samples have been obtained.

16. The method as claimed in claim 10, further comprising applying a dynamic range compression on pixels in the composite waveform image.

17. The method as claimed in claim 16, wherein applying a dynamic range comprises applying one of a gamma correction or a log function to the values in the training composite waveform image.

18. The method as claimed in claim 10, wherein acquiring one or more waveforms from the DUT further comprises obtaining a testing temperature.

19. The method as claimed in claim 18, wherein transforming the one or more waveforms into the composite waveform image further comprises encoding a graphical representation of the testing temperature into the composite waveform image.

* * * * *